(12) United States Patent
Bui et al.

(10) Patent No.: US 6,329,831 B1
(45) Date of Patent: Dec. 11, 2001

(54) METHOD AND APPARATUS FOR RELIABILITY TESTING OF INTEGRATED CIRCUIT STRUCTURES AND DEVICES

(75) Inventors: Nguyen Duc Bui, San Jose; Michael Anthony Niederhofer; Van Hung Pham, both of Milpitas, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 08/908,794

(22) Filed: Aug. 8, 1997

(51) Int. Cl.[7] .............................. G01R 31/26; G01R 31/02
(52) U.S. Cl. .............................. 324/765; 324/760
(58) Field of Search ................................ 324/765, 760, 324/763; 165/80.3, 80.4

(56) References Cited

U.S. PATENT DOCUMENTS

| | | | |
|---|---|---|---|
| 5,030,905 | * | 7/1991 | Figal ..................................... 324/760 |
| 5,124,638 | * | 6/1992 | Winroth ............................... 324/73.1 |
| 5,187,432 | * | 2/1993 | Bauernfeind et al. ............... 324/760 |
| 5,241,266 | * | 8/1993 | Ahmad et al. ........................ 324/765 |
| 5,390,129 | * | 2/1995 | Rhodes ............................... 324/158.1 |
| 5,414,370 | * | 5/1995 | Hashinaga et al. .................. 324/765 |
| 5,557,559 | * | 9/1996 | Rhodes ................................. 324/760 |
| 5,610,529 | * | 3/1997 | Schwondt ............................. 324/760 |
| 5,701,667 | * | 12/1997 | Birch et al. .......................... 324/760 |
| 5,760,595 | * | 6/1998 | Edwards et al. ..................... 324/760 |
| 5,798,653 | * | 8/1998 | Leung, Jr. ............................. 324/760 |
| 5,966,021 | * | 10/1999 | Eliashberg et al. .................. 324/760 |

OTHER PUBLICATIONS

Matthew N. O. Sadiku, "Elements of Electromagnetics," Second edition, Oxford University Press (1995), p. 3.*
O'Shea et al, "Introduction to Lasers and Their Applications," Adddison–Wesley Series in Physics (1978), pp. 5–8.*
Raymond A. Serway, "Physics for Scientists & Engineers," Third edition, Saunders Golden Sunburst Series (1992), pp. 973–976.*

* cited by examiner

Primary Examiner—Safet Metjahic
Assistant Examiner—Jermele Hollington

(57) ABSTRACT

A method and apparatus for monitoring and controlling integrated circuit devices-under-test (DUTS). A preferred embodiment includes a computer based controller, a temperature control module, a power supply controller, a chamber interface module, a driver card and a DUT board. The computer-based controller responding to preprogrammed instructions (software) operates and coordinates the temperature control module, the chamber interface module, the power supply controller, and the driver card. The driver card, receiving commands and data from the computer-based controller, sends and receives a number of signals to and from the DUTs on the DUT board. These signals include voltage sources for operating the DUTs, a load voltage, DC current sources for setting duty and frequency cycles, switch signals, voltage measurement signals, and resistance measurement signals. The DUT board is a printed circuit board for holding a number of DUTs. Each of the DUTs is an integrated circuit containing one or more sets of circuitry for testing specifically designed test structures.

21 Claims, 7 Drawing Sheets

METHOD AND APPARATUS FOR RELIABILITY TESTING OF INTEGRATED CIRCUIT STRUCTURES AND DEVICES

FIELD OF THE INVENTION

The present invention generally relates to methods and apparatuses for testing integrated circuit devices under various environmental and stress conditions, and, in particular, methods and apparatuses for reliability testing of interconnections and transistor structures in integrated circuits at ultra-high frequencies and under dynamically varying stress conditions.

BACKGROUND OF THE INVENTION

Integrated circuit reliability test systems have been devised to test the reliability of structures for interconnections or transistors in integrated circuit devices. The structures are placed under various dynamically varied environmental and stress conditions. For example, in order to design and implement a CPU to run at ultra-high frequencies (faster clock speeds), the interconnection structures and transistor structures for the CPU must be able to perform at these ultra-high frequencies and under the various dynamic stress conditions. Thus, before these structures are used in integrated circuit designs, they are specifically laid out in integrated circuit devices made specifically for testing purposes, where they are commonly referred to as devices-under-test (DUTs). The devices are then placed on a board where a number of signals can be fed to these DUTs. The board is then placed in a test chamber where the chamber can be programmed to create various environmental stress conditions such as variation in temperature and variation in electromagnetic field strength. While the board is in the chamber under programmed stress conditions, different types of signals at various frequencies can be provided to the DUTs to test the structures. Various characteristics of the structures within the DUTs can be monitored to appreciate the performance of the structures.

Referring to FIG. 1a, prior art systems provide a board 2 with a number of sockets for the placement of the DUTs (DUT1–DUT14). In routing the input signals to the DUTS, there is a connector 4 on the board to receive the input signals and to route the signals to each DUT via the data bus 6. The output signals generated by the DUTs are also passed back to the system via the data bus 6 and connector 4. One of the problems with this prior art system is that the input signal degrades when it travels down the data bus such that the input signal wave form at DUT1 is not the same as the input signal wave form at DUT7. This problem becomes particularly acute when the input signal is at a very high frequency such that a square wave form may become progressively less square the further away from the connector. FIG. 1b illustrates the wave form at DUT1 (FIG. 1a, 9) where the signal fairly resembles a square wave form input signal. FIG. 1c illustrates the wave form at DUT7 (FIG. 1a, 10) where the input signal has deteriorated such that it does not resemble the square wave form at all. A result of this phenomenon is that the input signals to the DUTs are not uniform and the results generated are therefore non-uniform and unreliable.

SUMMARY OF THE INVENTION

It is therefore an object of the present invention to provide a method and apparatus for uniformly and reliably testing of DUTs.

It is another object of the present invention to provide a method and apparatus for uniformly and reliably monitoring of DUTs.

It is yet another object of the present invention to provide a method and apparatus for uniformly and reliably delivering of input signals to the DUTs.

Briefly, a presently preferred embodiment provides a method and apparatus for monitoring and controlling devices under test. The preferred embodiment includes a computer based controller, a temperature control module, a power supply controller, a chamber interface module, a driver card and a DUT board. The computer-based controller responding to preprogrammed instructions (software) operates and coordinates the temperature control module, the chamber interface module, the power supply controller, and the driver card. The driver card, receiving commands and data from the computer-based controller, sends and receives a number of signals to and from the DUTs on the DUT board. These signals include voltage sources for operating the DUTs, a load voltage, DC current sources for setting duty and frequency cycles, switch signals, voltage measurement signals, and resistance measurement signals. The DUT board is a printed circuit board for holding a number of DUTs. Each of the DUTs is an integrated circuit containing one or more sets of circuitry for testing specifically designed test structures.

The circuitry of the DUT generally includes an oscillator with controllable duty cycle and frequency to excite the test structure. Measurement traces are provided on two sides of the test structure for measuring the characteristics of the test structure. The measured signals are then sent back to the driver card and to the computer-based controller for processing. In this manner, each DUT receives control signals in the form of DC current levels which control the duty cycle and the frequency of the wave form in testing the test structure. Since electrical DC current levels are fairly simple to control and can be uniformly delivered to each of the DUTs, the DUTs can be uniformly operated and tested. Therefore, the results generated by DUTs provide a higher level of consistency, uniformity, and reliability.

An advantage of the present invention is that it provides a method and apparatus for uniformly and reliably testing of DUTs.

Another advantage of the present invention is that it provides a method and apparatus for uniformly and reliably monitoring of DUTs.

Yet another advantage of the present invention is that it provides a method and apparatus for uniformly and reliably delivering of input signals to the DUTs.

These and other features and advantages of the present invention will become well understood upon examining the figures and reading the following detailed description of the invention.

IN THE DRAWINGS

DETAILED DESCRIPTION OF THE PREFERRED EMBODIMENTS

Figure 1A:
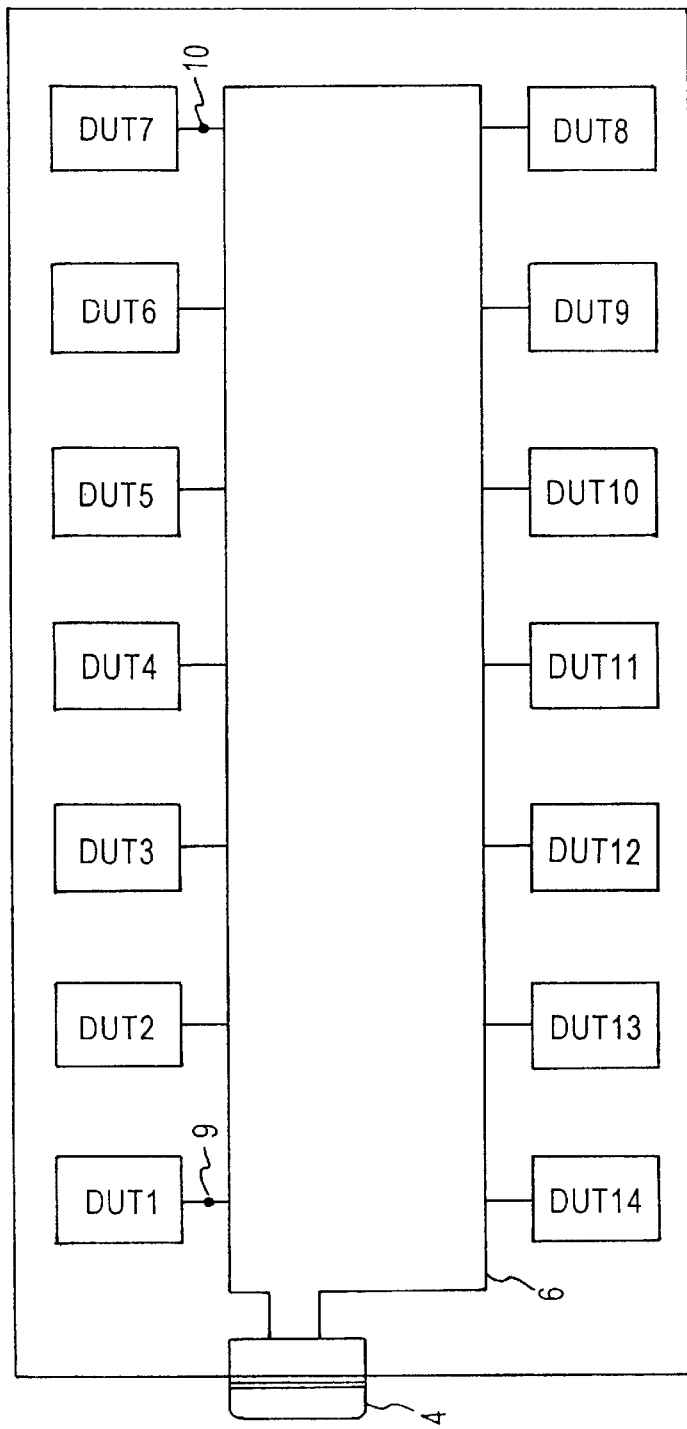
FIG. 1a illustrates a general layout of a DUT board having a data bus connecting a number DUTs.
Figure 1C:
FIG. 1c illustrates the wave form of a signal delivered to a DUT at a point away from the connector of the DUT board and the deterioration of the wave form.
Figure 1B:
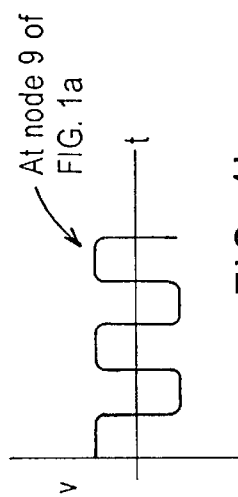
FIG. 1b illustrates the wave form of a signal delivered to a DUT at a point near the connector of the DUT board.
Figure 2:
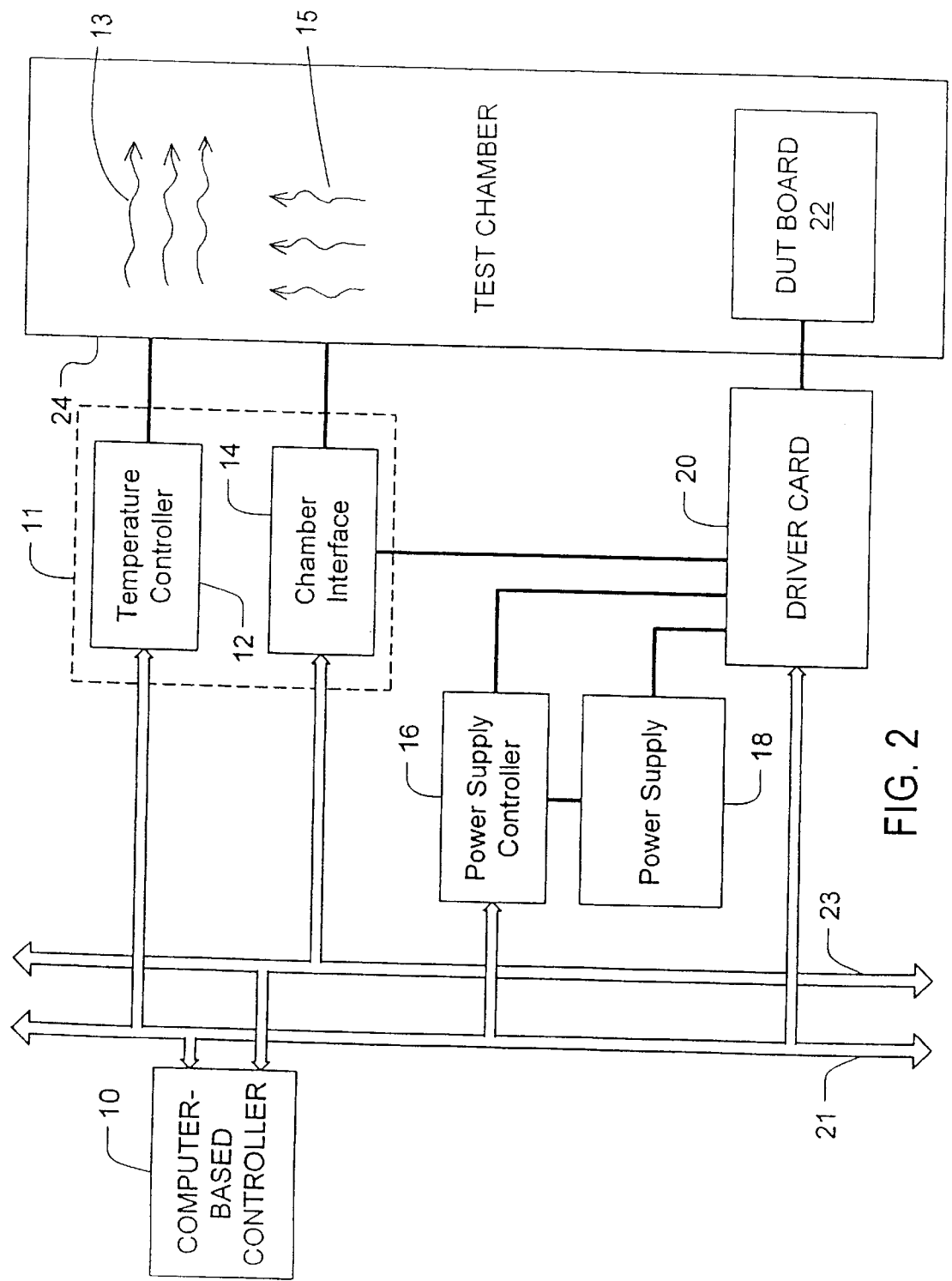
FIG. 2 illustrates the general block diagram of a preferred embodiment of the present invention.

Referring to FIG. 2, a preferred embodiment of the present invention includes a computer-based controller 10, a chamber controller 11 including a temperature control module 12 and a chamber interface module 14, a power supply controller 16, a power supply 18, a driver card 20, and a DUT board 22 which is placed inside a chamber 24. The chamber 24 is equipped to generate and produce stress conditions in response to the signals from the temperature control module 12 and the chamber interface module 14, where both of these modules are controlled and operated by the computer 10 via communication links 21 and 23. Specifically, the temperature control module 12 controls the temperature 13 in the test chamber 24 and the chamber interface module 14 controls the electromagnetic field 15 in the test chamber 24. The computer 10 also controls and operates the power supply controller 16 and the driver card 20. The driver card 20 in turn sends and receives signals to and from the DUT board 22. Although two communication links are illustrated herein, one communication link is sufficient.

Figure 3:
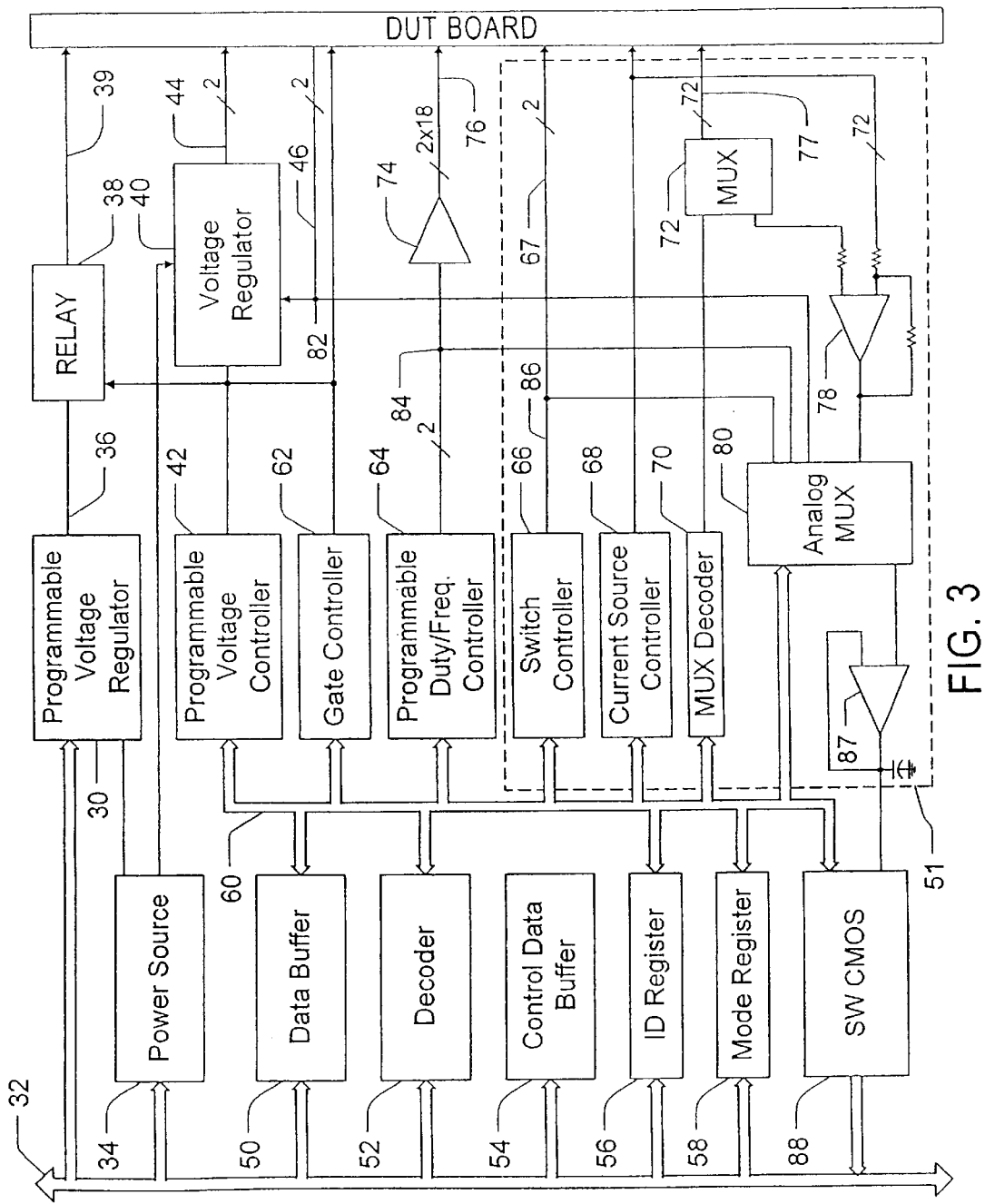
FIG. 3 illustrates the components of the driver card for the DUT board.

FIG. 3 provides a block diagram of the driver card. Here, there are a number of input signals and blocks of circuitries receiving the signals for carrying out specific tasks. A programmable voltage regulator 30 receives an auxiliary control signal from the data bus 32 and regulates the power from power source 34 accordingly. It generates and delivers a load voltage through a relay 38 to the DUTs for biasing the DUTS.

The power source 34 also provides power to a voltage regulator 40 which is controlled by a programmable voltage controller 42. The voltage regulator 40, in response to the programmable voltage controller 42, generates 2 voltages, $V_+$ and $V_{drive}$ at 44, for the DUTs. To ensure consistent voltage delivery, the two voltages are remote sensed read back and monitored by the voltage regulator 40 via lines 46.

The driver card receives various types of information from the computer where the information is stored or processed accordingly by the various components, including the data buffer 50, the decoder 52, the control data buffer 54, the ID register 56 or the mode register 58. The ID register 56 identifies the tray (or board) ID number, and the mode register places the board in the testing mode or the measurement mode. The data buffer 50 is connected to the driver card data bus 60. The decoder 52 reading from the data buffer 50 and the control data buffer 54 provides instructions and data to other modules, including the programmable voltage controller 42, the load gate controller 62, the programmable frequency and duty cycle controller 64, the switch controller 66, the current source controller 68 for measurement purposes, and the multiplexer decoder 70 for operating multiplexer 72.

The programmable voltage controller 42, as explained previously, controls the voltage regulator 40 which provides power to the DUTs. The load gate controller 62 operates to open or close the relay 38 for introducing the load potential to the DUTs. This relay 38 can be controlled by the programmable voltage controller 42 as well. The programmable frequency and duty cycle controller 64 provides a first current level for controlling the desired duty cycle and a second current level for controlling the desired frequency. The current levels are provided to amplifier sets 74, where a set of amplifiers is provided for each of the DUTs such that there is at least an amplifier for amplifying the duty cycle current level and an amplifier for amplifying the frequency current level. In the preferred embodiment, there are eighteen DUTs on the DUT board and therefore eighteen sets of DUT amplifiers for a total of thirty-six amplifiers.

For establishing the connections for measuring the test structures of the DUTs, referring to measurement subcircuit 51, there are two control switches which are CMOS switches operated by the switch controller 66. The current source controller 68 provides a reference current for measurement purposes. It is a constant voltage output device that converts the readings for the DUT devices into a current measurement to determine the resistance of the structure being tested or measured.

For each DUT, there are four monitor points for the high side 74 and four monitor points for the low sides 77 for monitoring the four test structures within each DUT. All of the signals from the monitored points are selectively provided via multiplexer 72 to a differential amplifier 78 and passed to an analog multiplexer 80. Multiplexer 72 is operated by mux decoder 70 which receives instructions and data via the data bus 60 as to which of the DUTs and which of the test structures within the selected DUT is to be monitored. The analog multiplexer 80 is operated by switch 88 and receives a number of signals as inputs for monitoring/feedback purposes, including the supplied voltage levels as indicated at 82, frequency and duty current levels at 84, and reference current source at 86. The output of the analog multiplexer 80 is amplified via amplifier 87 and selected via a signal from the data bus 32 through switch CMOS controller 88. In effect, the analog measurement is multiplexed and amplified (buffered) for the system.

As is illustrated, the DUT board is provided with a load voltage potential 39, $V_+$ and $V_{drive}$ voltage levels indicated at 44, current levels indicated at 76 for setting the frequency and duty cycle, and switch signals at 67. In operating the DUTs, the driver card monitors the voltage signal 46 and measures signals generated by the test structures of the DUTs 74 and 77.

Figure 4:
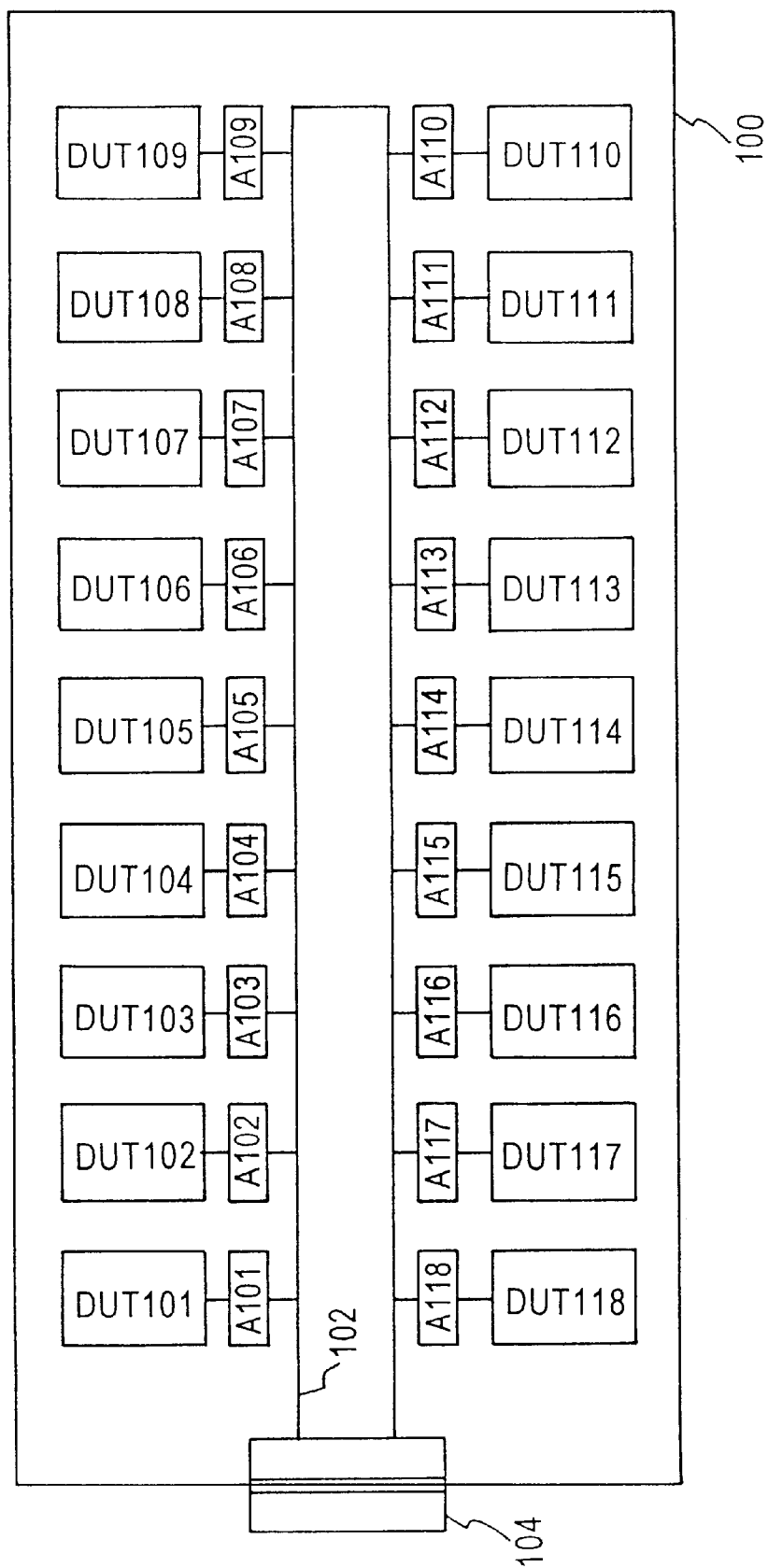
FIG. 4 illustrates a layout of the DUT board of the preferred embodiment.

Referring to FIG. 4, the general layout of a preferred DUT board is illustrated. In the preferred embodiment, there are eighteen sockets for placement of DUTs on the board 100 where each DUT is connected to a data bus 102 via auxiliary circuitries (A101–A118). The data bus is connected to a connector 104 for connection to the driver card. It should be noted that unlike the prior art, there is no limit as to the number of DUTs that can be placed on a board because of the advantageous method of the present invention in controlling and operating the DUTs.

Figure 5:
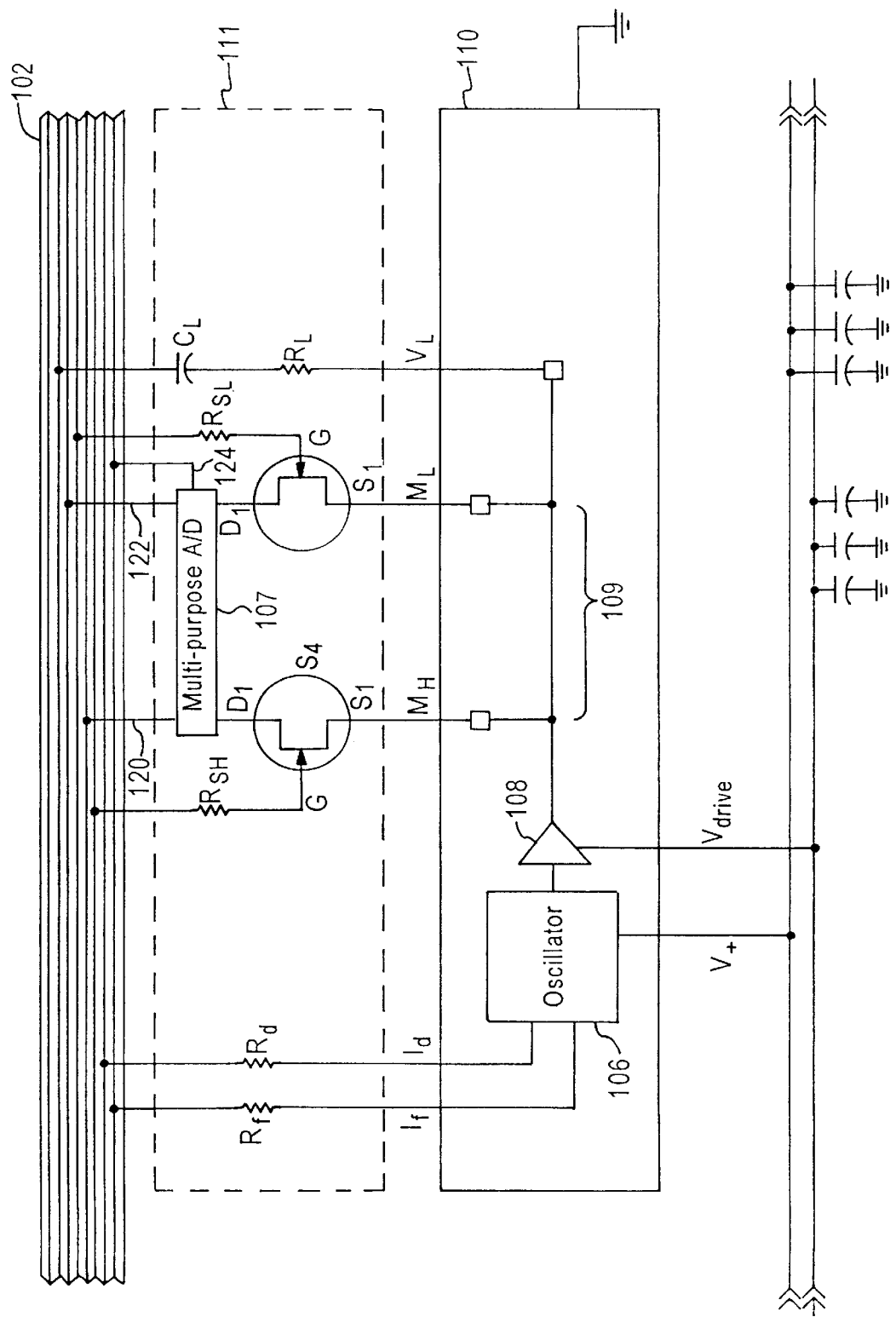
FIG. 5 illustrates an embodiment of the internal circuitry and the test structure that are within a DUT.

Referring to FIG. 5, the connections to a DUT 110 for one test structure is illustrated along with its auxiliary circuitry 111, noting that a DUT may contain several test structures and additional monitor lines would be needed in those cases. The DUT 110 is connected to the signal bus 102 via a number of signal lines. There is a line for receiving signal, $I_d$, for controlling the duty cycle to be generated by the oscillator 106, and a line for receiving signal $I_f$ for controlling the frequency of the duty cycle of the oscillator 106. The oscillator 106 is powered by $V_+$, a DC voltage. The output of the oscillator 106 is provided to an amplifier 108 powered by $V_{drive}$, and the output of the amplifier is connected to the test structure 109. Traces for measuring the two ends of the test structure is connected when switches $S_H$ and $S_L$ are closed. The switches are CMOS switches with respective drain, source, and gate terminals. The signal obtained from the test structure via the CMOS switch is passed to or through a multi-purpose analog-to-digital (A/D) converter 107, where the signal can be passed through without alteration or it can be converted to digital format and passed on to the bus. The advantage of converting the signal to digital format is to avoid the deterioration of the signal when it reaches the driver card. The A/D converter in response to a control signal from line 124 can process the signal from the test structure and generate digital information such as frequency count, duty cycle, etc. The digital output is delivered to the bus via lines 120 and 122, where each line can consist of several data bus signal lines for the deliverance of the digital data. A voltage potential, $V_L$, can be applied to the test structure to bias it.

In operation, $I_f$ and $I_d$ dictates the duty cycle and the frequency to be generated by the oscillator 106. The output of the oscillator 106 is amplified and provided to the test structure 109, which can be biased by applying a voltage potential, $V_L$. With this method where $I_d$ and $I_f$ are at steady DC levels, the test structure can be precisely excited to the desired state without having to be concerned with deterioration of the signal for exciting the test structure.

Test Structure Types

Figure 6A:
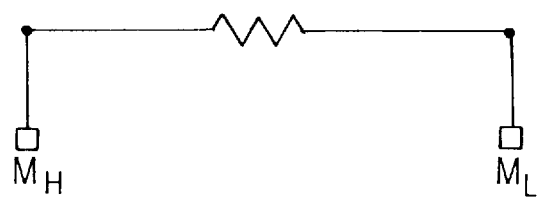
FIGS. 6a–6e illustrate some of the test structures that may be tested with a preferred embodiment of the present invention.

There are many different types of test structures that may be examined. FIG. 6a illustrates a simple interconnection with two measurement points, $M_L$ and $M_H$, where there is a slight amount of resistance within the interconnection. The concern here is with electromigration. Electromigration (EM) is the transport of metal ions through a conductor resulting from the passage of direct electrical current. It is a combination of thermal and electrical effects on mass motion. The higher the temperature, the easier it is for the metal ions to electromigrate. The presence of electric field further pushes the ions in the test structure. By examining the test structures under various conditions, the median time to failure (MTF) of the test structure can be determined.

Other types of test structures maybe tested as well, including testing for hot carrier effect and time-dependent dielectric breakdown condition of the transistors.

Hot Carrier Effect

Figure 6B:
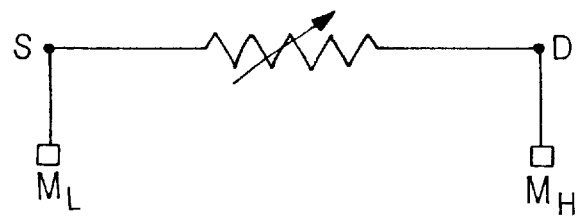

In the reverse-bias drain-to-substrate junction, the electric field may be quite high in short-channel devices. Carriers that are injected into the depletion layer are accelerated by the high field, and some of them may gain enough energy to cause impact ionization. These carriers have higher energy than the thermal energy and are called hot carriers. The holes generated by multiplication can flow to the substrate, giving rise to a large substrate current. Some of the holes may find their way to the source, effectively lowering the source barrier to induce electron injection. The electrons generated in the drain depletion layer are attracted to the positive gate voltage. If these electrons exceeds certain eV, they may be able to tunnel into the oxide or to surmount the silicon-oxide potential barrier to produce a gate current. In either case, electrons can be trapped inside the gate oxide, thus changing the threshold voltage and the current-voltage characteristics. This is not desirable and should be avoided. The drain current can be easily measured by using the method of the present invention by first exciting the transistor to certain threshold and measuring the resistance at the appropriate terminals of the transistor. FIGS. 6b and 6c illustrate two ways of connecting to a transistor structure to measure for the hot carrier effect.

Time-Dependent Dielectric Breakdown Condition

Oxide breakdown is an important process reliability subject in the development of MOS and CMOS technologies. Oxide breakdown is described by the test methods used to cause the dielectric breakdown. In time-dependent dielectric breakdown (TDDB) a constant voltage is applied across the gate oxide at a given temperature. The leakage current across the gate oxide is monitored, and the time to breakdown is recorded when the current exceeds some value.

Figure 6E:
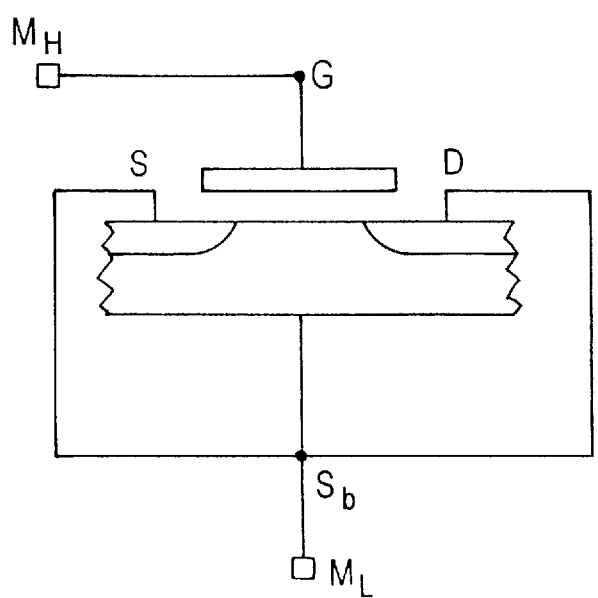
Figure 6C:
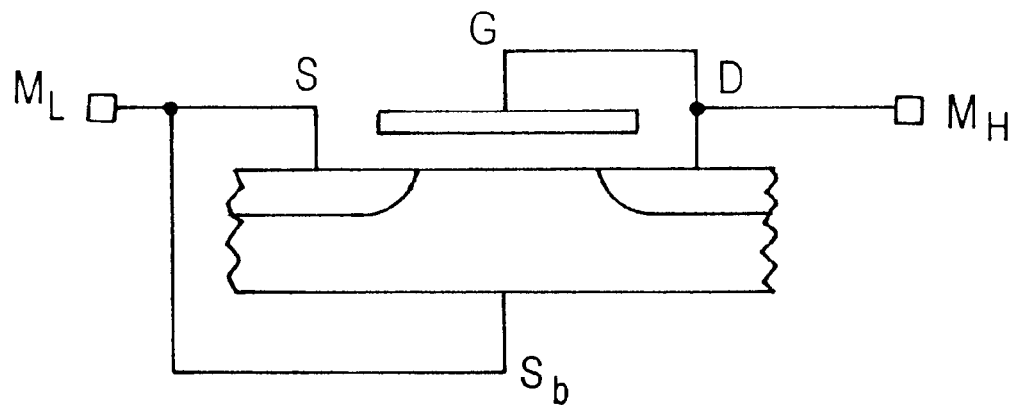
Figure 6D:
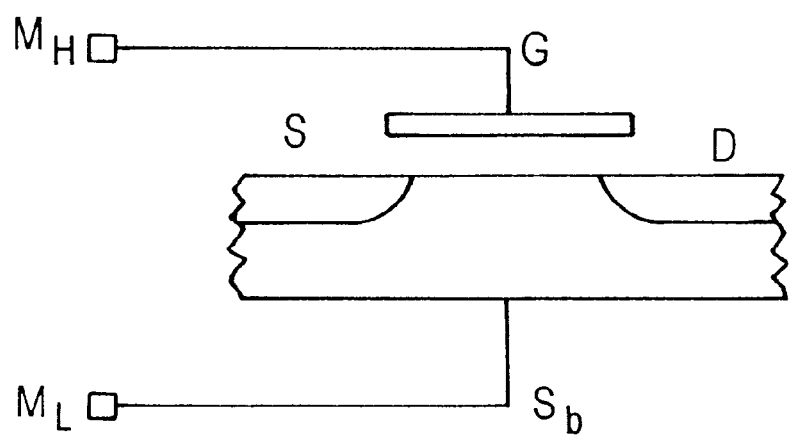

FIGS. 6d and 6e illustrate two ways of connecting to a transistor for measuring for the TDDB condition.

While the present invention has been described with reference to a certain preferred embodiment, it is to be understood that the present invention is not to be limited to such specific embodiments. Rather, it is the inventor's intention that the invention be understood and construed in its broadest meaning as reflected by the following claims. Thus, these claims are to be understood as incorporating and not only the preferred embodiment described herein but all those other and further alterations and modifications as would be apparent to those of ordinary skill in the art.

What is claimed is:

1. A system for testing integrated circuit devices and controlling and monitoring said integrated circuit devices-under tests (DUTs), comprising:

a test chamber for creating stress conditions to test DUTs;

a chamber controller communicatively connected to said test chamber for controlling stress conditions in said test chamber in response to chamber control signals, said chamber controller comprising a temperature controller for modifying the temperature in said test chamber and a chamber interface controller for controlling the electromagnetic field level in said test chamber;

a DUT board having one or more DUTs disposed thereon;

a driver card communicatively connected to said DUT board for operating and monitoring said DUTs on said DUT board;

an adjustable power supply;

a power supply controller for controlling power from said adjustable power supply to said driver card and to said DUT board;

a computer for providing control signals to said chamber controller, said power supply controller, and said driver card in operating said test chamber and said DUTs and in monitoring the performance of said DUTs; and whereby said computer operates said chamber controller to dynamically vary the temperature and control the electromagnetic field in said test chamber and generates signals to said DUTs to test and monitor said DUTs.

2. A system as recited in claim 1 wherein said DUT board includes a circuit board;

a connector disposed on said circuit board;

a data bus disposed on said circuit board and communicatively connected to said connector; and one or more of said DUTs disposed on said circuit board and being communicatively connected to said data bus for receiving one or more DUT control signals and for providing signals generated in response to said DUT control signals.

3. A system as recited in claim 2 where said DUT board further includes an auxiliary circuit disposed between each of said DUTs and said data bus for controlling and conditioning the signals to and from said data bus and said DUTs.

4. A system as recited in claim 3 wherein said auxiliary circuit includes at least one transistor switch for selectively establishing the connections for measuring the DUTs.

5. A system as recited in claim 1 wherein said driver card includes:
   an external data bus for receiving instructions and data from said computer;
   a buffer for storing said instructions and data;
   a decoder for executing and routing said instructions and data from said buffer;
   a programmable voltage controller responsive to said instructions and data and operative to control a voltage regulator for delivering voltage supply to said DUTs;
   a programmable duty and frequency controller responsive to said instructions and data and operative to control said DUTs; and
   a measurement circuit for measuring said DUT's and providing measured signals to said computer.

6. A system as recited in claim 5 wherein said measurement circuit further comprises:
   a switch controller for selectively establishing the connections for measuring a selected DUT; and
   a multiplexer for selecting said selected DUT for receiving a measured signal representative of a characteristic of the test structure of said selected DUT.

7. A system as recited in claim 6 wherein said measurement circuit further includes a reference current source controller for providing a reference current to said selected DUT in measuring said selected DUT.

8. A system as recited in claim 5 wherein said driver card further includes a gate controller for controlling the delivery of a voltage potential for biasing said DUTs.

9. A system as recited in claim 5 wherein said driver card further includes a mode register for placing said driver card in a test mode or a measurement mode.

10. A system as recited in claim 1 wherein the control signals for operating said DUTs are DC signals.

11. A system as recited in claim 1 wherein each of said DUTs includes:
   an oscillator for receiving a DUT control signal and generating an AC signal having a frequency corresponding to said DUT control signal; and
   a test structure having at least two measurable ends for testing and measuring the characteristics of said test structure, one of said measurable ends connected to said oscillator.

12. A system as recited in claim 11 wherein each test structure is connected to a biasing voltage source.

13. A system as recited in claim 11 wherein each of said DUTs further includes an amplifier for amplifying said AC signal for the test structure.

14. A system as recited in claim 2 wherein said DUT control signals are DC signals.

15. A system as recited in claim 5 wherein said programmable duty and frequency controller operates said DUTs by providing DC signals at specified levels.

16. A method for examining test structures within integrated circuits devices-under-test (DUTs) under dynamically varying environmental conditions, comprising the steps of:
   placing a DUT board having one or more DUTs disposed thereon in a test chamber;
   adjusting environmental conditions including temperature and an electromagnetic field within said test chamber to predefined levels; and
   operating the test structures within a DUT by providing one or more DC control signals to said DUT, said DC control signals causing an excitation signal to be applied to the test structure of said DUT under the control of a computer.

17. A method as recited in claim 16 further including the step of measuring the response of the test structure of said DUT in response to said excitation signal.

18. A semiconductor test circuit, comprising:
   an oscillator for receiving one or more DC control signals and for generating an AC signal having a frequency level and a duty cycle corresponding to said DC control signals; and
   a test structure having a first measurable end and a second measurable end for testing and measuring the characteristics of said test structure, said first measurable end receiving said AC signal from said oscillator.

19. A semiconductor test circuit as recited in claim 18 wherein said second measurable end of said test structure is connected to a biasing voltage source.

20. A semiconductor test circuit as recited in claim 18 wherein said second measurable end of said test structure receives a load voltage for biasing said test structure.

21. A system as recited in claim 5 wherein said driver card further includes a programmable voltage regulator for providing a voltage potential for biasing said DUTs.

* * * * *